(12) United States Patent
Sandhu et al.

(10) Patent No.: US 8,421,140 B2
(45) Date of Patent: Apr. 16, 2013

(54) DIELECTRIC STRUCTURES

(75) Inventors: Gurtej S. Sandhu, Boise, ID (US); Guy T. Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/613,203

(22) Filed: Jul. 3, 2003

(65) Prior Publication Data
US 2004/0097034 A1 May 20, 2004

Related U.S. Application Data

(62) Division of application No. 09/589,671, filed on Jun. 7, 2000, now Pat. No. 6,617,206.

(51) Int. Cl.
*H01L 21/02* (2006.01)

(52) U.S. Cl.
USPC ...... 257/310; 257/635; 257/637; 257/E21.01; 438/240; 438/763; 438/785

(58) Field of Classification Search ........ 257/303, 257/310, 302, 635, 503, 300, E21.01, 637, 257/638, E21.635, E21.639, E21.009, E21.647, 257/651, 9, 1, E21.637; 438/240, 387, 397, 438/957, 783, 784, 785, 786, 787, 287, 761, 438/763, 396
See application file for complete search history.

(56) References Cited

U.S. PATENT DOCUMENTS

| | | | |
|---|---|---|---|
| 5,187,638 A | 2/1993 | Sandhu et al. | |
| 5,290,609 A * | 3/1994 | Horiike et al. | 438/396 |
| 5,335,138 A | 8/1994 | Sandhu et al. | |
| 5,392,189 A * | 2/1995 | Fazan et al. | 361/305 |
| 5,440,157 A * | 8/1995 | Imai et al. | 257/310 |
| 5,489,548 A * | 2/1996 | Nishioka et al. | 438/396 |
| 5,506,166 A | 4/1996 | Sandhu et al. | |
| 5,576,564 A * | 11/1996 | Satoh et al. | 257/295 |
| 5,654,222 A | 8/1997 | Sandhu et al. | |
| 5,656,852 A * | 8/1997 | Nishioka et al. | 257/632 |
| 5,686,748 A | 11/1997 | Thakur et al. | |
| 5,688,724 A | 11/1997 | Yoon et al. | 437/235 |
| 5,837,593 A * | 11/1998 | Park et al. | 438/396 |
| 5,841,186 A | 11/1998 | Sun et al. | 257/635 |
| 6,172,385 B1 | 1/2001 | Duncombe et al. | 257/295 |
| 6,174,564 B1 | 1/2001 | Scott et al. | 427/126.3 |
| 6,177,305 B1 * | 1/2001 | Hornback et al. | 438/240 |
| 6,200,874 B1 | 3/2001 | Sandhu et al. | |
| 6,207,489 B1 * | 3/2001 | Nam et al. | 438/240 |
| 6,228,702 B1 * | 5/2001 | Hirota | 438/240 |
| 6,232,167 B1 * | 5/2001 | Satoh et al. | 438/240 |
| 6,235,572 B1 | 5/2001 | Kunitomo et al. | |
| 6,307,731 B1 | 10/2001 | Katori | 361/305 |
| 6,358,810 B1 * | 3/2002 | Dornfest et al. | 438/396 |

(Continued)

*Primary Examiner* — Julio J Maldonado
*Assistant Examiner* — Daniel Shook
(74) *Attorney, Agent, or Firm* — Schwegman, Lundberg & Woessner, P.A.

(57) ABSTRACT

A capacitor structure and method of forming it are described. In particular, a high-K dielectric oxide is provided as the capacitor dielectric. The high-K dielectric is deposited in a series of thin layers and oxidized in a series of oxidation steps, as opposed to a depositing a single thick layer. Further, at least one of the oxidation steps is less aggressive than the oxidation environment or environments that would be used to deposit the single thick layer. This allows greater control over oxidizing the dielectric and other components beyond the dielectric.

22 Claims, 6 Drawing Sheets

U.S. PATENT DOCUMENTS

| | | | |
|---|---|---|---|
| 6,362,068 B1 * | 3/2002 | Summerfelt et al. | 438/396 |
| 6,403,441 B1 * | 6/2002 | Takehiro et al. | 438/396 |
| 6,586,790 B2 | 7/2003 | Kanaya et al. | |
| 6,933,225 B2 * | 8/2005 | Werkhoven et al. | 438/627 |
| 7,294,544 B1 | 11/2007 | Ho et al. | |
| 2006/0258113 A1 | 11/2006 | Sandhu et al. | |

\* cited by examiner

DIELECTRIC STRUCTURES

RELATED APPLICATION

This application is a divisional of U.S. application Ser. No. 09/589,671, filed Jun. 7, 2000, now U.S. Pat. No. 6,617,206.

FIELD OF THE INVENTION

The present invention relates generally to a capacitor structure and its method of manufacture. More particularly, the present invention relates to a capacitor structure for high-density memory arrays.

BACKGROUND OF THE INVENTION

Without limiting the scope of the invention, its background is described in connection with prior methods of forming capacitor structures for dynamic random access memory (DRAM) using high-dielectric-constant materials (or high-K dielectrics). By high-dielectric-constant, it is meant a dielectric constant greater than 10 at room temperature, and preferably a dielectric constant greater than 20.

Advances in miniaturization of integrated circuits have led to smaller areas available for devices such as transistors and capacitors. For example, in semiconductor manufacture of a memory array for a DRAM, each memory cell comprises a capacitor and a transistor. In a conventional DRAM, pairs of memory cells are located within regions ("memory cell areas") defined by intersecting row lines ("word lines") and column lines ("bit lines" or "digit lines"). Accordingly, to increase memory cell density of the memory array, row lines and column lines are positioned with minimal spacing ("pitch"). Using minimal pitch in turn constrains memory cell area. In high-density memory array architecture, a memory array will have a bit line-to-bit line pitch equal to or less than 0.5 microns.

In conflict with reducing memory cell area is maintaining a sufficient amount of memory cell charge storage capacitance. Each DRAM memory comprises a capacitor for storing charge. A capacitor is two conductors separated by a dielectric, and its capacitance, C, is mathematically determinable as:

$$C=(\in_r \in_o A)/d,$$

where $\in_o$ is a physical constant; dielectric constant, $\in_r$, is a material dependant property; distance, d, is distance between conductors; and area, A, is common surface area of the two conductors.

To increase capacitance, C, per unit area, the DRAM industry is pursuing depositing materials with a high permittivity for use as capacitor dielectrics. Many perovskites, ferroelectrics, and other high-dielectric-constant materials have capacitance densities greater than standard silicon dioxide ($SiO_2$) and silicon nitride ($Si_3N_4$) capacitor dielectrics.

Many perovskites have the chemical formula $ABO_3$, where A is one or more monovalent, divalent, or trivalent elements and B is one or more pentavalent, tetravalent, trivalent, or divalent elements. Examples of high-dielectric-constant ferroelectric oxides include niobium pentoxide ($Nb_2O_5$); tantalum pentoxide ($Ta_2O_5$); and titanates including lead zirconate titanate ($PbTiZrO_3$, abbreviated PZT) and barium strontium titanate ($BaSrTiO_3$, abbreviated BST). Other high-dielectric-constant materials include but are not limited to non-oxide ferroelectrics, such as barium fluoride ($BaF_2$) and magnesium fluoride ($MgF_2$). Depending on the dielectric constant, $\in_r$, of these materials, as well as the application, they may be used in parallel plate capacitor structures, such as stack capacitors or mini-stack capacitors, or vertical capacitor structures including container capacitors and trench capacitors.

High-dielectric-constant oxides are conventionally deposited in one step at elevated temperatures (greater than 500 degrees Celsius) in an oxygenated atmosphere (such as $O_2$). Examples of processes for depositing high-dielectric-constant oxides are ion-beam sputtering, chemical vapor deposition, and pulsed laser deposition. It has been found that in such an environment, the capacitor electrode layer oxidizes, thereby causing an unwanted reduction in capacitance. Moreover, such high-dielectric-constant oxides are often annealed or re-oxidized after deposition, which further exacerbates the oxidation problem.

In addition, other problems may occur if high-dielectric-constant oxide dielectrics are deposited directly on silicon (Si) capacitor electrodes. In addition to oxidation or other undesirable reactions between the electrode and dielectric, silicon may migrate into the high-dielectric-constant oxide, thereby reducing its permittivity and the capacitor's capacitance.

One option to at least partially prevent these problems is to provide a barrier layer, such as a layer of germanium (Ge) or silicon nitride ($Si_3N_4$), between the silicon electrode and the high-dielectric-constant oxide. The oxidation conditions present after the deposition of this barrier layer may result in the oxidation of that layer, but this is actually preferable in certain circumstances. Regardless, it is desired in the art that this layer will prevent oxidation of the electrode. Unfortunately, the oxidation conditions in effect while forming the entirety of the high-K dielectric in one step often still cause oxidation of the silicon electrode despite the presence of the barrier layer. In addition, forming a barrier layer adds complexity to the manufacturing process and reduces the effective dielectric constant of the capacitor.

As an alternative to depositing dielectric on a silicon electrode, high-dielectric-constant oxides may be deposited on nonreactive metals or conductive metal oxides comprising the capacitor electrode. The term "nonreactive" when used in context with contact to a high-dielectric-constant oxide herein means a material that provides a stable conductive interface during and after processing. Examples of nonreactive metals include noble metals such as lead (Pd) or platinum (Pt). Exemplary conductive metal oxides include ruthenium oxide ($RuO_2$). Single and multiple metal layers may used to form the capacitor electrode. However, while this solves some of the problems associated with silicon electrodes, the problem of oxidizing the electrode during or after the formation of the high-K dielectric still exists.

As a result, it would be desirable to form a high-dielectric-constant oxide such that the likelihood of decreasing capacitance is reduced.

SUMMARY OF THE INVENTION

Accordingly, the present invention provides a dielectric for a capacitor structure or other device, and method of formation thereof. Rather that provide a single layer of dielectric under a particular set of oxidation parameters, one exemplary embodiment of the current invention instead provides a plurality of thinner dielectric layers, wherein providing at least the layer nearest the capacitor electrode is accomplished under less aggressive oxidizing parameters. Such exemplary embodiments allow for greater control over the oxidation that may occur beyond the dielectric.

BRIEF DESCRIPTION OF THE DRAWINGS

Features and advantages of the present invention will become more apparent from the following description of the preferred embodiments described below in detail with reference to the accompanying drawings where.

Figure 1A:
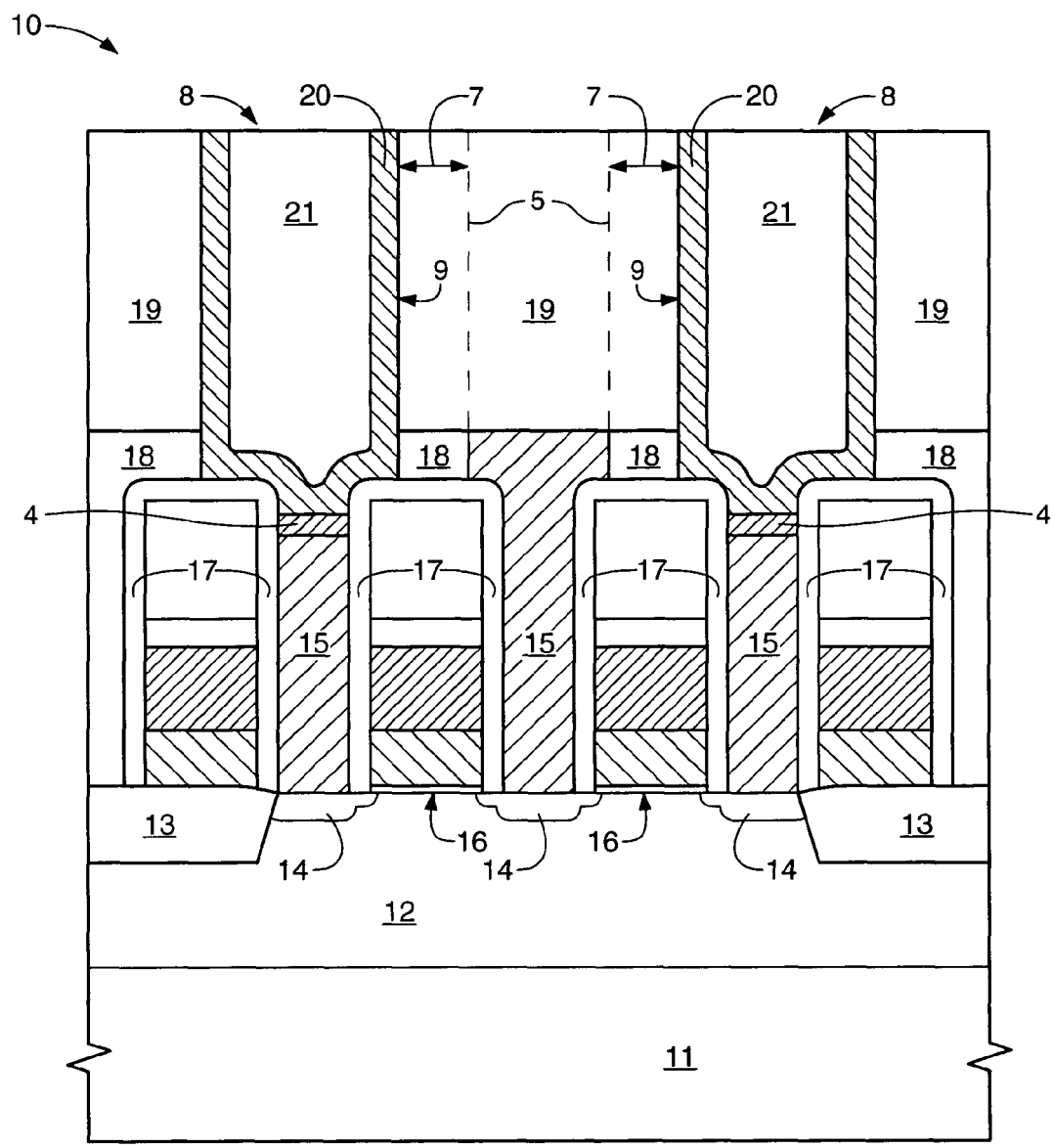
FIGS. 1A and 1B are cross-sectional views of in-process DRAM substrate assemblies of the prior art.

Reference numbers refer to the same or equivalent parts of embodiments of the present invention throughout the several figures of the drawing.

DESCRIPTION OF THE PREFERRED EMBODIMENTS

In the following detailed Description of the Preferred Embodiments section, reference is made to the accompanying drawings which form a part of this disclosure, and which, by way of illustration, are provided for facilitating understanding of the exemplary embodiments. It is to be understood that embodiments other than the exemplary embodiments disclosed herein may be practiced without departing from the scope of the present invention. The following exemplary embodiments, directed to manufacture of dynamic random access memories (DRAMs), are provided to facilitate understanding of the present invention. Accordingly, some conventional details with respect to manufacture of DRAMs have been omitted to more clearly describe the exemplary embodiments herein.

Referring to FIG. 1A, there is shown a cross-sectional view of an in-process DRAM substrate assembly 10 of the prior art. By substrate assembly, it is meant a substrate comprising one or more layers formed thereon or therein. Further, in the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above. Substrate assembly 10 comprises a slice of a single crystalline semiconductor 11. In semiconductor 11, a well 12 is formed. In well 12 are formed conductive implant regions 14. Shallow trench isolation regions 13 are formed in semiconductor 11 by removing a portion thereof and filling the remaining hole with one or more dielectric materials. Transistor gate stacks 16 are formed on semiconductor 11, and are separated from conductive studs 15 by spacers 17. Dielectric layers 18 and 19 are deposited and etched to provide holes for deposition of conductive layer 20.

Conductive layer 20 is then polished to form a planar surface. As chemical-mechanical-polishing (CMP) is conventionally used for such polishing, photosensitive polymer 21 is deposited to protect substrate assembly 10 from potential contaminants associated with CMP. Conductive layer 20 provides bottom electrodes for container capacitor structures.

Dashed-lines 5 indicate a proximate location for a contact via for connection to a conductive stud 15 therebelow. Separation 7 between dashed-lines 5 and outer surface 9 of conductive layer 20 bottom electrodes is about or less than 0.1 microns for a high-density DRAM array.

Notably, though an exemplary embodiment of the present invention is described herein in terms of a container capacitor structure for a high-density DRAM array, it should be understood that the present invention may be employed to form container, stack, mini-stack, trench, or other capacitor structures in DRAM devices or in devices other than DRAM. The present invention may be implemented in a variety of other integrated circuit devices including but not limited to memory devices, logic devices having embedded memory, application specific integrated circuits, microprocessors, microcontrollers, digital signal processors, and the like incorporating a memory array which employs one or more capacitors. Moreover, a memory or a memory module having a capacitor formed in accordance with the present invention may be employed in various types of information handling systems. Such systems include network cards, telephones, scanners, facsimile machines, routers, televisions, video cassette recorders, copy machines, displays, printers, calculators, and personal computers, and the like systems incorporating memory.

Figure 1B:
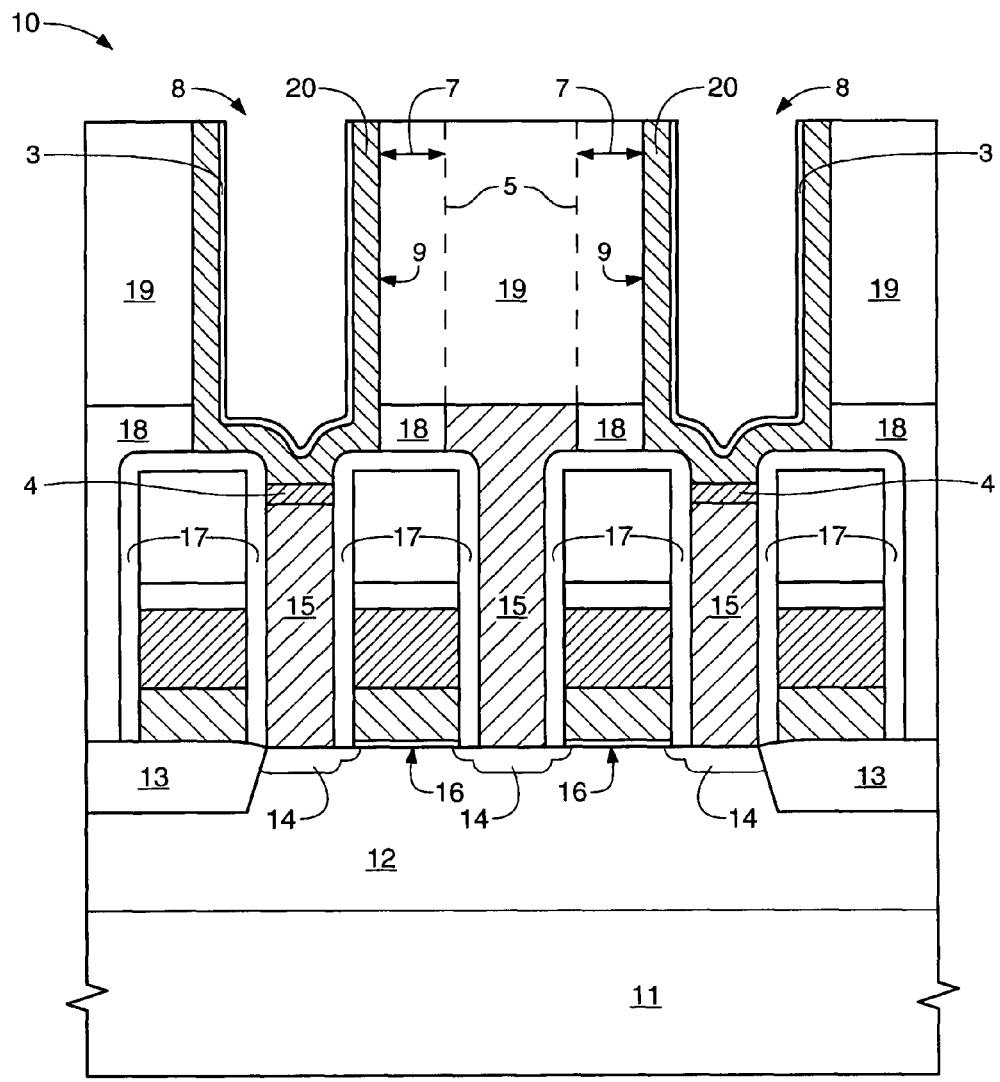

Again, referring to FIG. 1A, conductive layer 20 provides a first electrode for a capacitor structure; in the exemplary embodiment illustratively shown, it is a container capacitor structure; however, conductive layer 20 may be thought of as a bottom electrode for any form of capacitor. Conductive layer 20 may be formed of one or more layers of one or more materials. An optional barrier layer 4 may be formed between conductive layer 20 and conductive stud 15 to limit unwanted effects due to diffusion. Examples of oxygen diffusion limiting barrier materials that are conductors include metal nitrides, conductively formed semiconductors (e.g., germanium doped with a material designated as an electron acceptor or an electron donor), and conductively formed semiconductor nitrides (e.g., silicon nitride doped with a material designated as an electron acceptor or an electron donor). This barrier layer 4, however, does not limit or prevent unwanted effects of interaction between conductive layer 20 and a subsequently deposited high-dielectric-constant capacitor dielectric. As a result, another barrier layer 3, such as the one described in the background section and pictured in FIG. 1B, may be provided between these layers.

With respect to these examples, oxidation of the conductive layer 20 will occur during or after a one-step formation of the full amount of high-K dielectric that will be used in the completed capacitor. By way of example and not limitation, if conductive layer 20 comprises silicon and a high-dielectric-constant oxide is deposited on it, then silicon dioxide may be formed. In addition, oxygen may reach other layers under the conductive layer 20 and create undesirable effects in other materials. Further, other undesirable reactions or material migrations may also occur.

To mitigate unwanted interaction, the present invention offers exemplary embodiments that allow for formation of a high-K dielectric under conditions that minimize if not completely prevent oxidation beyond the dielectric. Rather than form the entire amount of dielectric at once under a given set of parameters, exemplary embodiments teach forming the dielectric in a plurality of steps, wherein each step provides only a portion of the total dielectric to be used in the completed device. Moreover, at least a first oxidation step involved with providing the dielectric is carried out under parameters that result in less aggressive oxidation in comparison to the prior art parameters.

Figure 2A:
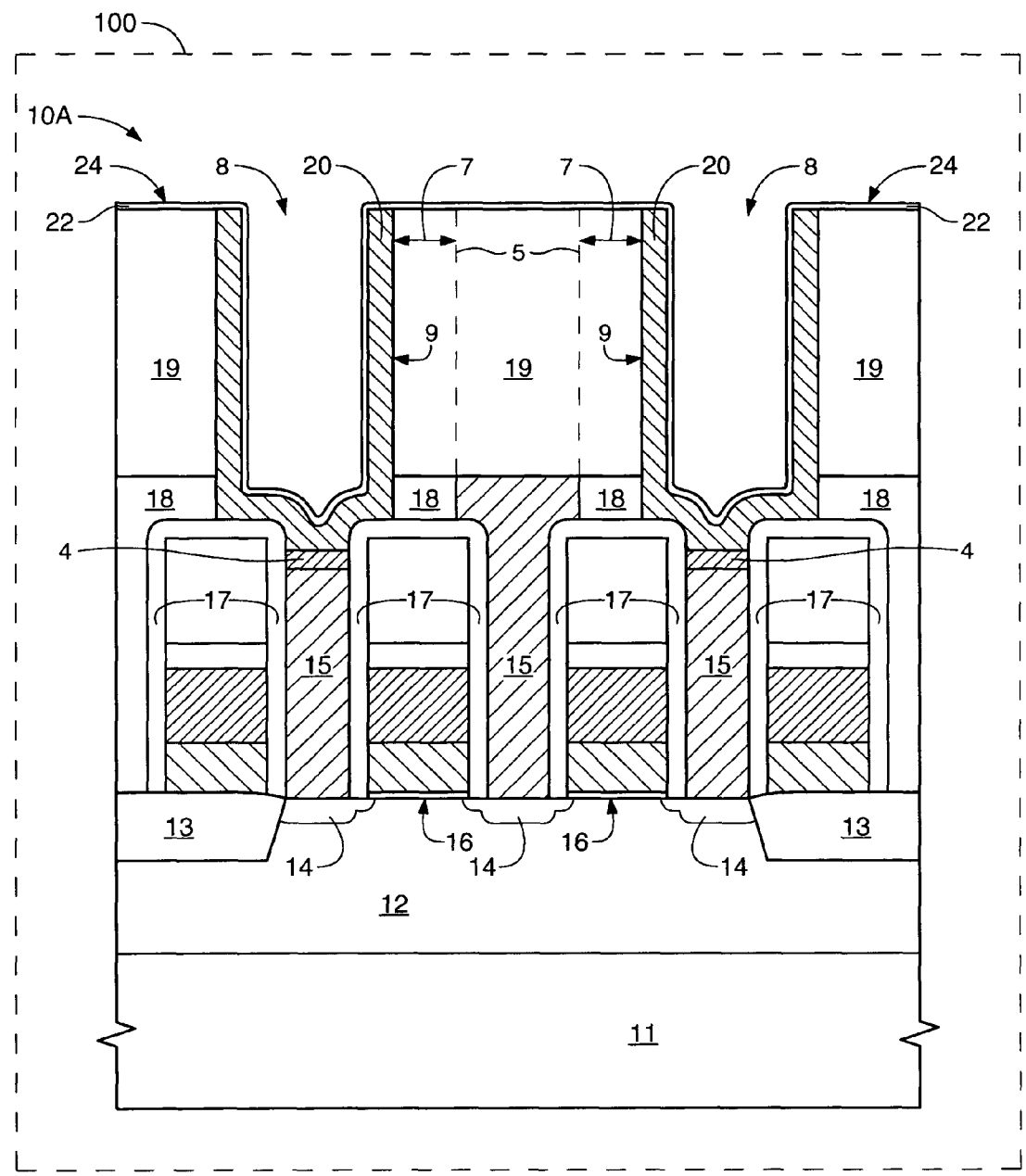
FIGS. 2A and 2B are cross-sectional views of exemplary embodiments in accordance with the present invention.
Figure 2B:
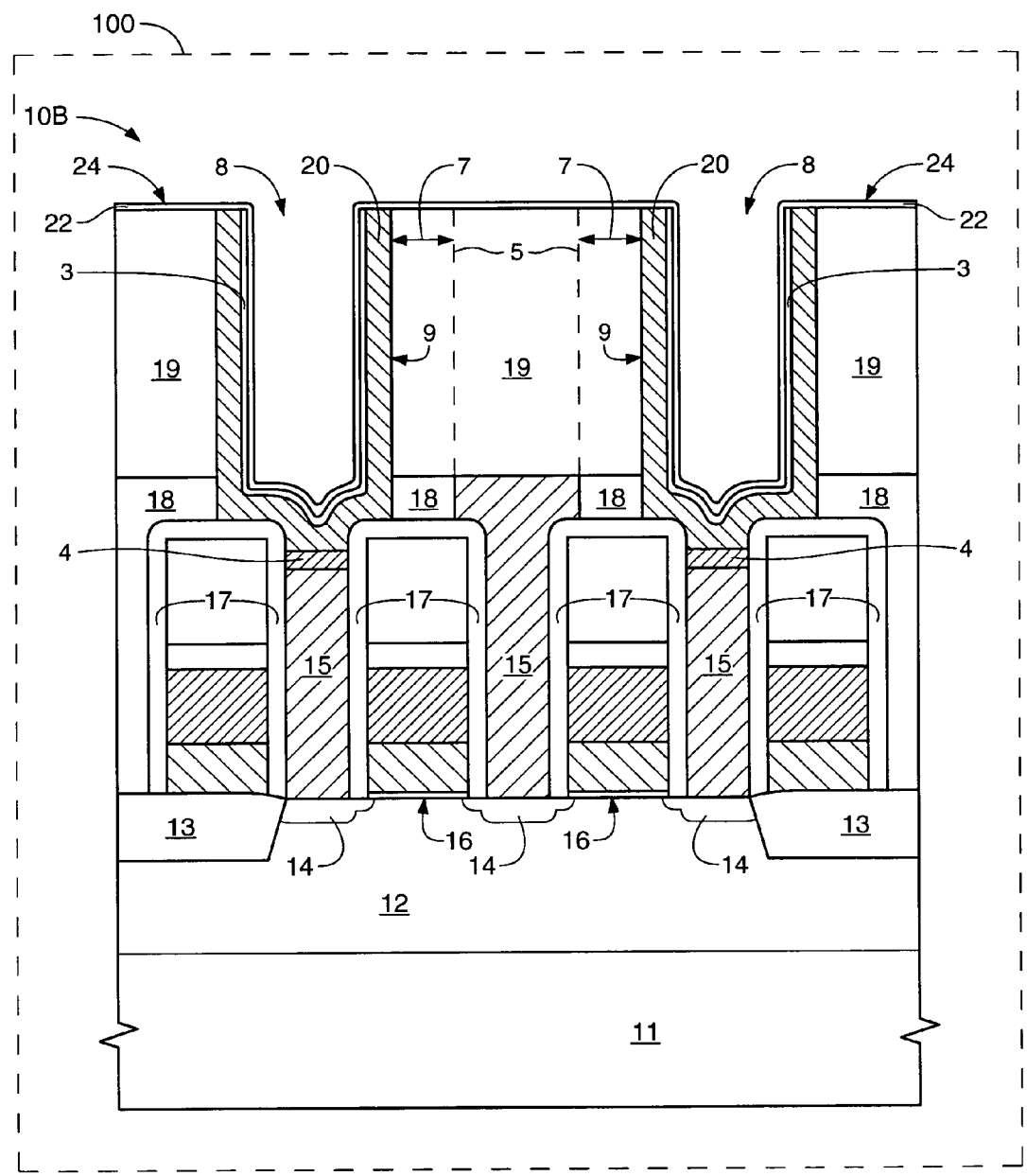

Referring to FIG. 2A, there is shown a cross-sectional view of an in-process DRAM substrate assembly 10A in accordance with the present invention. Conductive layer 20 may comprise an acceptor or donor doped semiconductor, platinum, palladium, rhodium, gold, iridium, silver, titanium nitride, tin nitride, ruthenium nitride, zirconium nitride, ruthenium dioxide, tin oxide, titanium monoxide, and combinations thereof. FIG. 2B illustrates an alternative exemplary portion of a substrate assembly 10B, wherein conductive layer 20 comprises hemispherical-grain-silicon having phosphorous added thereto for conductivity. Also added to the substrate assembly 10B is a silicon nitride barrier layer 3.

In either embodiment, a first layer 22 of capacitor dielectric 24 is subsequently formed. First layer 22 may be formed at least in part by chemical-vapor-deposition (CVD), physical-vapor-deposition (PVD), jet-vapor deposition (JVD), liquid deposition (e.g., spin-on, liquid injection, and the like), atomic layer deposition/epitaxy (ALD/ALE), or other means for controlled deposition of a material. Further, it should be noted that at least one oxidation step is used in providing many kinds of capacitor dielectric both in prior art and in exemplary embodiments of the current invention. For instance, oxidation may play an integral part of the initial deposition process so that an oxide is formed as a direct result of that process. Directly depositing a tantalum oxide is one example. Alternatively, a non-oxide may be initially deposited, followed by an oxidation step. Depositing tantalum and then oxidizing that layer into tantalum oxide serves as an example of this alternative process. Regardless of the method used to provide the oxide, such an oxide is often later subjected to an anneal in an oxidizing ambient in order to fill oxygen vacancies and burn away impurities in the oxide. Any of these oxidation steps can take place by way of one or a combination of oxidizing methods.

Many of these oxidizing methods involve subjecting the substrate assembly 10A/10B to a thermal process in an oxygen containing atmosphere. Such an atmosphere may contain a gas including $O_2$, $O_3$, $N_2O$, NO, $H_2O$, or combinations thereof. The thermal energy can be provided in a furnace, wherein resistance to the conduction of electricity through the furnace coils generates the heat for the substrate assembly 10A/10B. As another option, the substrate assembly 10A/10B could be placed in a rapid thermal process device such as the Centura HT tool, sold by Applied Materials, set to RTO (rapid thermal oxidation) mode. In such a device, a lamp shines light on the substrate assembly 10A/10B, which heats in reaction to absorbing the light. Alternatively, a reactor could be used to generate an oxygen-containing plasma, remote or local, for the substrate assembly 10A/10B. As yet another option, an anodic oxidation process using an electrolytic solution could be used to provide the oxidizing environment.

Returning to the tantalum oxide example, prior art indicates that it is known to deposit, in one step, 50 to 70 Angstroms of tantalum oxide. Exemplary parameters for doing so involve a CVD process wherein a tantalum precursor such as tantalum chloride ($TaCl_5$) is carried by a gas such as argon into a furnace at a rate of 10 sccm to 2000 sccm. Further, an oxygen-containing gas such as $N_2O$ is introduced to the furnace at a rate of 0.1 SLM to 5 SLM. The pressure inside the furnace is at 0.1 Torr to 10 Torr, and the temperature inside the furnace ranges from 800° C. to 850° C. Under parameters such as these, the full amount of tantalum oxide will form after about 30 minutes. In contrast, an exemplary embodiment of the current invention involves providing a first layer 22 of tantalum oxide whose thickness is within the range of 10 to 40 Angstroms (preferably 20 Angstroms), wherein deposition can occur in the same furnace and with the same atmosphere but at a lower temperature—ranging from 400° C. to less than 800° C. (preferably around 450° C.)—and a process time of about 1 minute. Thus, assuming that it is desired to ultimately have a dielectric thickness of 50-70 Angstroms, this exemplary embodiment teaches initially providing about 14% to 80% of that total.

As another example, BST can be deposited as the first layer 22. Prior art teaches providing a full 200 Angstroms at 650° C. Embodiments of the current invention allow for initially providing a first layer 22 comprising BST, wherein the thickness ranges from 20-80 Angstroms and the temperature is less than 650° C., preferably between 400° C. and less than 650° C. Assuming that it is desired to ultimately have a dielectric thickness of 200 Angstroms, this exemplary embodiment teaches initially providing about 10% to 40% of that total.

As a third example, it is assumed that a Metal-Insulator-Metal (MIM) capacitor configuration is desired, wherein tantalum pentoxide $Ta_2O_5$ serves as the insulator. Prior art involves deposition parameters such as an ozone ambient and a temperature of 500° C., wherein the parameters result in the full amount of high-K dielectric being deposited. Exemplary embodiments of the current invention allow for less than the full amount of high-K dielectric to be initially deposited under less aggressive oxidation conditions in terms of time, temperature, pressure, oxygen source, other ambient gasses, or any other parameter.

These examples demonstrate that the oxidation environment used during or after the deposition of the full amount of high-K oxide to be used in the capacitor results from a cooperation of several parameters, including the ones specified above as well as others such as the presence of excitation sources (like plasma or UV radiation) and their associated values. The current invention includes within its scope exemplary embodiments wherein less than the full amount of high-K oxide is initially provided, and oxidation associated with that initial amount is less than the oxidation that occurs in relation to depositing the full amount. The oxidation may occur during the deposition of an oxide dielectric, after the deposition of a non-oxide layer, or after the oxide has been provided. The oxidation may occur by way of any known method of oxidation, such as RTO, furnace oxidation, or other methods described above. The lesser oxidation is achieved by altering the oxidation parameters, such as in the ways described above as well as others.

Figure 3A:
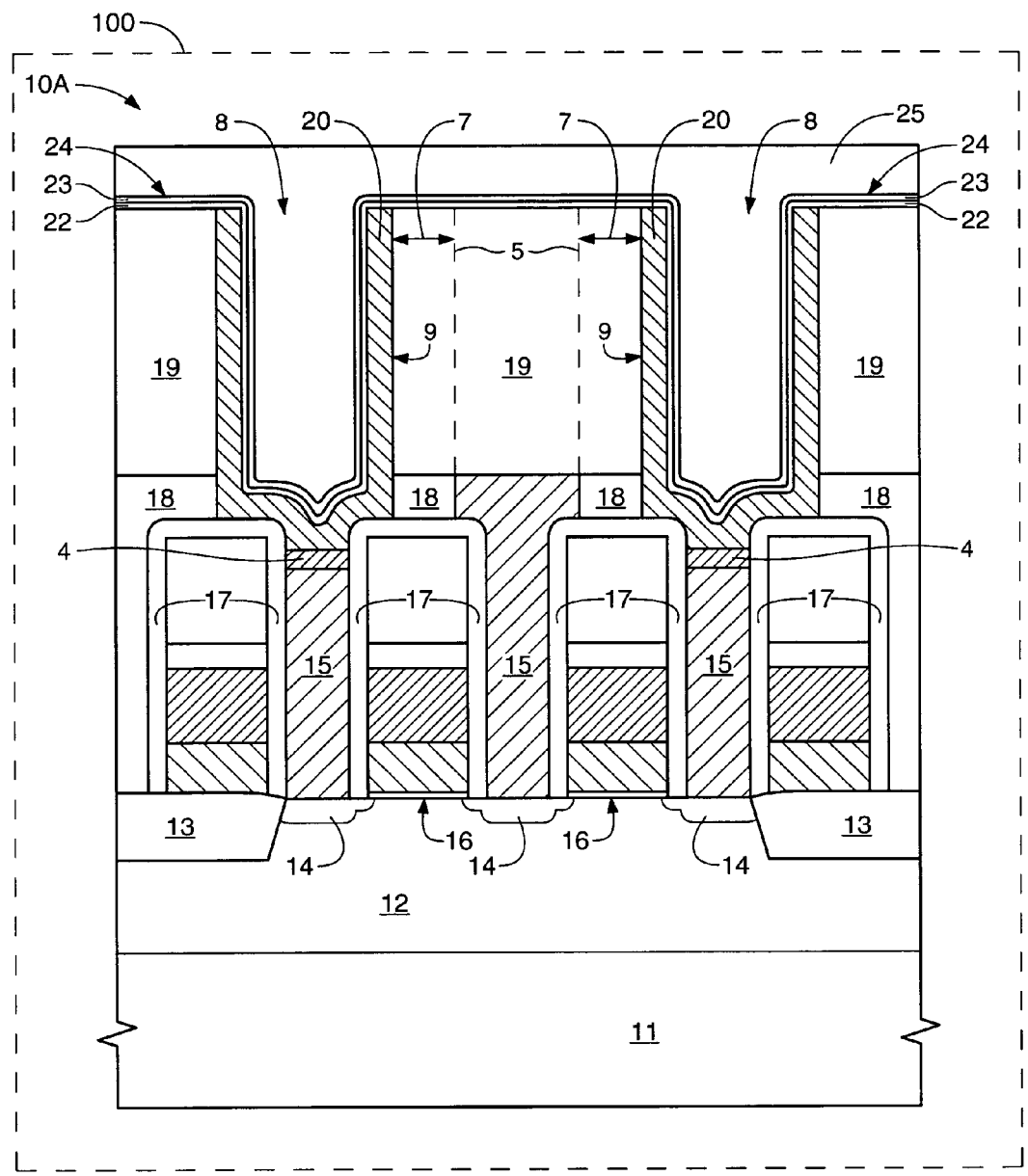
FIGS. 3A and 3B are cross-sectional views of exemplary embodiments in accordance with the present invention having undergone additional processing.
Figure 3B:
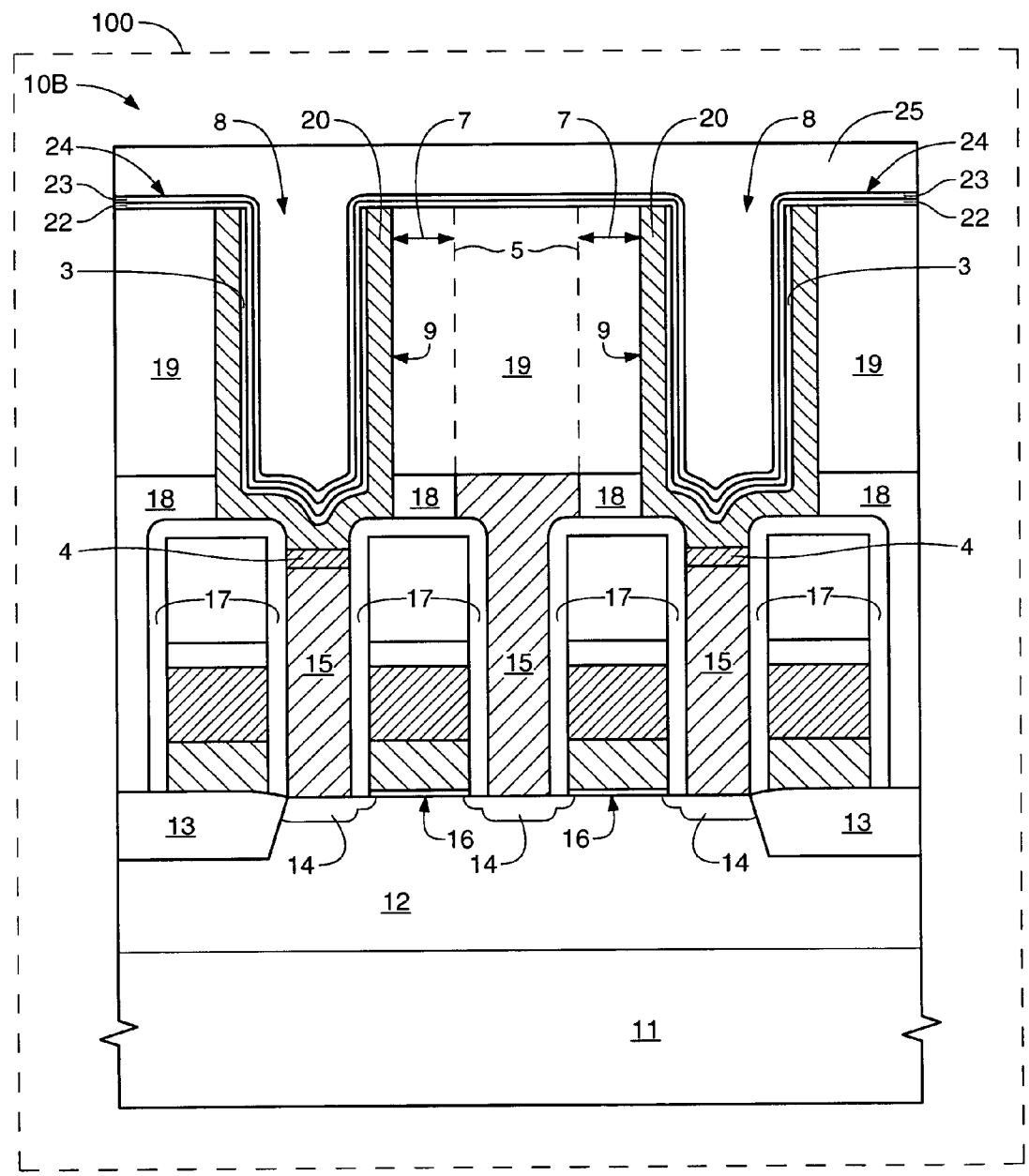

After depositing and oxidizing first layer 22, second layer 23 of capacitor dielectric 24 is formed, as illustratively shown in the cross-sectional views of FIGS. 3A and 3B. Second layer 23 can be formed in a manner similar to that of the first layer 22. However, that is not a requirement under the current invention. Second layer 23 may be deposited with different oxidation parameters in effect during or after deposition. Further, it is not necessary that the oxidation parameters for the second layer 23 be less aggressive than those for the first layer 22. Returning to the MIM example, the second layer 23 of $Ta_2O_5$ can be deposited at a temperature ranging from 400° C. to 700° C. Thus, the oxidation parameters can exceed even those used in the prior art to oxidize the full amount of high-K dielectric deposited in one step. In addition, second layer 23 may be provided to define a thickness differing from the thickness of the first layer 22. Moreover, the type of high-K dielectric may be different from the high-K dielectric forming the first layer 22 in terms of the types of high-K dielectric components or their proportion.

High-dielectric-constant materials that may be used include perovskites, ferroelectrics, high-dielectric-constant oxides, acceptor doped perovskites, acceptor doped ferroelectrics, acceptor doped high-dielectric-constant oxides, donor doped perovskites, donor doped ferroelectrics, donor doped high-dielectric-constant oxides, and combinations thereof. The high-dielectric-constant material may be doped with a material selected from: Na, Al, Mn, Ca, La, Nb, F, K, Cr, Mn, Co, Ni, Cu, Zn, Li, Mg, Cl, V, Mo, Ce, Pr, Nd, Sn, Eu, Gd, Tb, Dy, Ho, Er, Ta, W, and combinations thereof.

By repetitively forming sub-layers of capacitor dielectric 24, a desired thickness may be achieved while allowing greater control of the oxidation process than one would have by forming one layer of capacitor dielectric having that thickness. In embodiments such as the one depicted in FIG. 3A, oxidation may be generally restricted to the capacitor dielectric 24, thereby leaving the conductive layer 20 substantially free of oxide. A similar result may be achieved in the exemplary embodiment depicted in FIG. 3B, but it would be preferred to allow oxidation to extend to the barrier layer 3 while still leaving the conductive layer 20 substantially free of oxide. The above described methods allow such a result.

After forming a plurality of sub-layers of capacitor dielectric 24, conductive layer 25 may be deposited to provide a top electrode portion for capacitor 8. Conductive layer 25 may comprise acceptor doped silicon, donor doped silicon, copper, aluminum, platinum, palladium, rhodium, gold, iridium, silver, titanium nitride, tin nitride, ruthenium nitride, zirconium nitride, ruthenium dioxide, tin oxide, titanium monoxide, and combinations thereof.

It should be understood that substrate assembly 10A of FIGS. 2A, 2B, 3A and 3B may be formed in a single chamber 100 or in a cluster of chambers 100 without breaking vacuum. It should be understood that though only two sub-layers 22 and 23 are described herein, the present invention may be employed to provide two or more sub-layers for forming capacitor dielectric layer 24.

The present invention has been particularly shown and described with respect to certain preferred embodiments. However, it will be readily appreciated to those of ordinary skill in the art that a wide variety of alternate embodiments, adaptations or variations of the preferred embodiments, and/or equivalent embodiments may be made without departing from the intended scope of the present invention as set forth in the appended claims. For example, the thickness of the initially deposited dielectric sub-layer can be as little as the thickness of one atom comprising that layer (in which case the sub-layer would be considered to be a "monolayer") depending upon the tendency of subsequent processing steps to encourage oxygen diffusion. Further, it should be understood that exemplary embodiments of the current invention have applications in metal-insulator-silicon (MIS) structures as well as MIM structures discussed above and other structures known in the art. For instance, at least one exemplary embodiment of the current invention allows for an MIS device comprising a top metal electrode, a top $Ta_2O_5$ layer under the top metal electrode, a bottom $Ta_2O_5$ layer under the top $Ta_2O_5$ layer, a silicon nitride layer under the bottom $Ta_2O_5$ layer, and a bottom silicon electrode under the silicon nitride layer. In addition, the current invention is not limited to providing a capacitor dielectric. Rather, the invention has applications in any circumstance wherein controlling the oxidation of a dielectric or other insulator layer is beneficial. Accordingly, the present invention is not limited except as by the appended claims.

The invention claimed is:

1. A substrate assembly, comprising:
   a support surface having a uniform composition and extending into a recess formed in the substrate;
   a conductive layer spaced apart from the support surface and extending into the recess; and
   a plurality of high-K dielectric layers positioned between the support surface and the conductive layer, including an un-annealed first high K dielectric layer, and a second high K dielectric layer including deposited components different from those in the first high K dielectric layer, wherein an interface between the support surface and the first high K dielectric layer remains free of a support surface oxide present in the plurality of high-K dielectric layers.

2. The substrate assembly in claim 1, wherein said plurality of high-K dielectric layers comprises a first high-K dielectric layer contacting said support surface.

3. The substrate assembly in claim 1, further comprising a barrier layer between said support surface and said plurality of high-K dielectric layers.

4. The substrate assembly in claim 1, wherein said support surface is a capacitor electrode.

5. The substrate assembly in claim 1, wherein said plurality of high-K dielectric layers defines a thickness of at most 200 angstroms.

6. The substrate assembly in claim 5, wherein said plurality of high-K dielectric layers comprises a first high-K dielectric layer contacting said support surface and defining a thickness of at least a monolayer.

7. The substrate assembly in claim 6, wherein said first high-K dielectric layer defines a thickness of at least 10 angstroms.

8. A capacitor dielectric, comprising:
   an un-annealed first high-K capacitor dielectric of tantalum pentoxide formed on a support surface, wherein an interface between the first high-K capacitor dielectric and the support surface is substantially free of a support surface oxide;
   a second high-K capacitor dielectric of tantalum pentoxide, contacting said first high-K capacitor dielectric, and
   a conductive layer spaced apart from the support surface and extending into a recess, wherein the first high-K capacitor dielectric and the second high-K capacitor dielectric abut the support surface and the conductive layer.

9. The capacitor dielectric in claim 8, wherein said first high-K capacitor dielectric defines a first thickness; and wherein said second high-K capacitor dielectric defines a second thickness that is different from said first thickness.

10. A capacitor dielectric, comprising:
    an un-annealed first high-K capacitor dielectric of tantalum pentoxide;
    a second high-K capacitor dielectric of a high-K dielectric having at least one different component that the first high-K capacitor dielectric and contacting said first high-K capacitor dielectric,
    wherein said first high-K capacitor dielectric and said second high-K capacitor dielectric are oxides;
    a support surface having a uniform composition and extending into a recess that supports the first high-K dielectric layer and the second high-K dielectric layer that remains free of support surface oxides at an interface between the first high-K dielectric layer and the support surface; and
    a conductive layer spaced apart from the support surface and extending into the recess, wherein the first high-K capacitor dielectric and the second high-K capacitor dielectric abut the support surface and the conductive layer.

11. A capacitor structure, comprising:
    a first electrode layer having a uniform composition and extending into a recess in a substrate;
    a dielectric layer disposed over said first electrode layer, wherein said dielectric layer comprises a plurality of consecutively-positioned sub-layers, wherein each of said sub-layers comprises a high-dielectric-constant material, wherein at least one of the sub-layers includes an un-annealed deposited dielectric component different from one or more of the other sub-layers, and wherein one of said sub-layers is more oxidized than another of said sub-layers, further wherein the first electrode layer remains free of an electrode layer oxide at an interface between the electrode layer and the dielectric layer; and a second electrode layer disposed over said dielectric layer and extending into the recess.

12. A capacitor dielectric, comprising a plurality of capacitor dielectric layers defining a total thickness ranging from 50 to 70 angstroms, wherein each layer of said plurality is a tantalum pentoxide high-K dielectric defining an individual thickness ranging from 10 to 40 angstroms in thickness, and a dielectric layer adjacent a supporting surface is un-annealed, further wherein a supporting surface having a uniform composition and extending into a recess and abutting the plurality of capacitor dielectric layers remains free of a supporting surface oxide at an interface between the supporting surface and the capacitor dielectric, and an electrode layer is disposed over the plurality of dielectric layers, the electrode extending into the recess.

13. The capacitor dielectric of claim 12, wherein at least a lowest layer of said plurality defines an individual thickness of about 20 angstroms.

14. A capacitor dielectric, comprising a plurality of capacitor dielectric layers positioned between a supporting surface having a uniform composition and extending into a recess and an electrode layer extending into the recess, the dielectric layers defining a total thickness ranging from 50 to 70 angstroms, wherein each layer of said plurality is a high-K dielectric defining an individual thickness ranging from 10 to 40 angstroms in thickness, and a dielectric layer adjacent a supporting surface is un-annealed, wherein at least one layer of said plurality manifests greater oxidation than would an equal thickness of an underlying layer of said plurality, wherein at least one layer in the plurality includes a component not present in other layers of the plurality, and wherein the underlying layer includes a means to minimize oxidation beyond the plurality of capacitor dielectric layers and into the supporting surface that extends into the recess, further wherein an underlying layer oxide is absent from an interface between the capacitor dielectric and the underlying layer.

15. A capacitor dielectric, comprising a plurality of capacitor dielectric layers disposed between a supporting surface having a uniform composition and extending into a recess and an electrode layer extending into the recess, wherein each layer of the plurality is a high-K dielectric, and a dielectric layer adjacent a supporting surface is un-annealed, further wherein at least one layer of the plurality manifests a greater oxidation than would be present in an equal thickness of an underlying layer of the plurality, and wherein at least one layer in the plurality includes a component not present in other layers of the plurality, further wherein an underlying layer oxide is absent from an interface between the capacitor dielectric and the underlying layer.

16. The capacitor dielectric of claim 15, wherein the plurality of capacitor dielectric layers defines a total thickness that ranges between approximately 50 angstroms and approximately 70 angstroms.

17. The capacitor dielectric of claim 15, wherein each layer of the plurality defines an individual layer thickness that ranges between approximately 10 angstroms and approximately 40 angstroms.

18. The capacitor dielectric of claim 15, wherein at least a lowest layer of the plurality defines an individual thickness of approximately 20 angstroms.

19. A capacitor dielectric, comprising a plurality of capacitor dielectric layers abutting a supporting surface having a uniform composition and extending into a recess and an electrode layer extending into the recess, wherein each layer of the plurality is a high-K dielectric, and a dielectric layer adjacent a supporting surface is un-annealed, further wherein at least one layer of the plurality manifests a greater oxidation than would an equal thickness of an underlying layer of the plurality, wherein each layer of the plurality comprises tantalum pentoxide included within an adjacent layer of the plurality, and wherein the underlying layer includes a means to minimize oxidation beyond the plurality of capacitor dielectric layers, further wherein an underlying layer oxide is substantially absent from an interface between the capacitor dielectric and the underlying layer.

20. The capacitor dielectric of claim 19, wherein the plurality of capacitor dielectric layers defines a total thickness that ranges between approximately 50 angstroms and approximately 70 angstroms.

21. The capacitor dielectric of claim 19, wherein each layer of the plurality defines an individual layer thickness that ranges between approximately 10 angstroms and approximately 40 angstroms.

22. The capacitor dielectric of claim 19, wherein at least a lowest layer of the plurality defines an individual thickness of approximately 20 angstroms.

\* \* \* \* \*

UNITED STATES PATENT AND TRADEMARK OFFICE
CERTIFICATE OF CORRECTION

PATENT NO. : 8,421,140 B2
APPLICATION NO. : 10/613203
DATED : April 16, 2013
INVENTOR(S) : Gurtej S. Sandhu et al.

It is certified that error appears in the above-identified patent and that said Letters Patent is hereby corrected as shown below:

In the Claims:

In column 10, line 33, in Claim 19, delete "substantially absent" and insert -- absent --, therefor.

Signed and Sealed this
Eighteenth Day of June, 2013

Teresa Stanek Rea
*Acting Director of the United States Patent and Trademark Office*